United States Patent
Mitsui et al.

(10) Patent No.: US 6,800,182 B2
(45) Date of Patent: Oct. 5, 2004

(54) SPUTTERING TARGET, PROCESS FOR ITS PRODUCTION AND FILM FORMING METHOD

(75) Inventors: Akira Mitsui, Kanagawa (JP); Hiroshi Ueda, Hyogo (JP); Kouichi Kanda, Hyogo (JP); Susumu Nakagama, Mie (JP)

(73) Assignee: Asahi Glass Company, Limited, Tokyo (JP)

(*) Notice: Subject to any disclaimer, the term of this patent is extended or adjusted under 35 U.S.C. 154(b) by 285 days.

(21) Appl. No.: 10/121,695

(22) Filed: Apr. 15, 2002

(65) Prior Publication Data

US 2002/0117785 A1 Aug. 29, 2002

Related U.S. Application Data

(63) Continuation of application No. PCT/JP00/07088, filed on Oct. 12, 2000.

(30) Foreign Application Priority Data

Oct. 13, 1999 (JP) .............................. 11-291480

(51) Int. Cl.[7] .......................... C23C 14/00; B28B 3/00; B28B 3/20
(52) U.S. Cl. ................. 204/298.13; 264/642; 264/643; 204/192.1
(58) Field of Search ................................ 264/642, 643; 501/54; 204/192.1, 298.01, 298.02, 298.13

(56) References Cited

U.S. PATENT DOCUMENTS

| | | | | |
|---|---|---|---|---|
| 3,951,587 A | * | 4/1976 | Alliegro et al. | 432/253 |
| 4,847,211 A | * | 7/1989 | Lee | 257/66 |
| 5,364,571 A | * | 11/1994 | O'Connor et al. | 264/29.5 |
| 6,129,742 A | * | 10/2000 | Wu et al. | 607/1 |
| 6,248,291 B1 | * | 6/2001 | Nakagama et al. | 419/46 |

FOREIGN PATENT DOCUMENTS

| | | |
|---|---|---|
| JP | 63-113507 | 5/1988 |
| JP | 1-192541 | 8/1989 |
| JP | 4-132639 | 5/1992 |
| JP | 4-260637 | 9/1992 |
| JP | 5-501587 | 3/1993 |
| JP | 9-508176 | 8/1997 |
| JP | 11-61394 | 3/1999 |
| JP | 2000-104162 | 4/2000 |

* cited by examiner

Primary Examiner—Christopher A. Fiorilla
(74) Attorney, Agent, or Firm—Oblon, Spivak, McClelland, Maier & Neustadt, P.C.

(57) ABSTRACT

A sputtering target is provided that includes SiC and metallic Si and has an atomic ratio of C to Si of from 0.5 to 0.95 and a density of from $2.75 \times 10^3$ kg/m$^3$ to $3.1 \times 10^3$ kg/m$^3$. The sputtering target is capable of forming at high speed a film that contains $SiO_2$ as the main component and has a low refractive index. The sputtering target can be produced by a process in which a molded product of SiC is impregnated with molten Si.

15 Claims, No Drawings

SPUTTERING TARGET, PROCESS FOR ITS PRODUCTION AND FILM FORMING METHOD

BACKGROUND OF THE INVENTION

Field of the Invention

The present invention relates to a target to be used for forming a film comprising $SiO_2$ as the main component by a sputtering method, a process for its production, and a film-forming method for a film comprising $SiO_2$ as the main component by means of such a target.

DESCRIPTION OF THE BACKGROUND

Heretofore, as a material for a low refractive index film (refractive index n<1.6), $SiO_2$ (n=1.46), $MgF_2$ (n=1.38) or the like, has been known. Such a film material can be formed into a film by a vacuum deposition method or a wet-coating method, but a sputtering method is employed in many cases when a film is formed on a substrate of a large area, such as glass for buildings, glass for automobiles, a cathode ray tube (CRT) or a flat display. Among sputtering methods, a direct current (DC) sputtering method utilizing direct current discharge, is particularly suitable for film forming over a large area. Heretofore, it has been difficult to form a $SiO_2$ film having high mechanical durability by a sputtering method in an atmosphere containing oxygen (a so-called reactive sputtering method) employing a Si target, because abnormal discharge (arcing) takes place. In recent years, a technique to suppress arcing has been developed, such as an improvement of the film-forming apparatus, whereby forming of a $SiO_2$ film by a reactive sputtering method has been practically carried out, but the film-forming speed is not yet adequate. Further, a polycrystal Si target or a single crystal Si target to be used has had a problem that it is susceptible to cracking along grain boundaries or crystal faces. In order to make it hardly susceptible to cracking, a Si target having Al incorporated, has been proposed (JP-A-5-501587) but as Al is incorporated as an impurity into the $SiO_2$ film, there has been a problem that the refractive index of the film increases. Further, there has been another problem that the film-forming speed is slow.

Further, it has been proposed to use a sintered SiC target to form a $Si_xO_yC_z$ film (JP-A-63-113507), but, when the sintered SiC target is employed, the film-forming speed has not been adequate.

It is an object of the present invention to provide a target whereby a film comprising $SiO_2$ as the main component and having a low refractive index, can be formed at a high speed by a sputtering method, a process for its production, and a film forming method for a film comprising $SiO_2$ as the main component by means of such a target.

Another object of the present invention is to provide a target whereby a film comprising $SiO_2$ as the main component and having a low refractive index, can be formed at a high speed by a sputtering method, and the durability against cracking during film forming is improved, a process for its production, and a film-forming method for a film comprising $SiO_2$ as the main component by means of such a target.

DISCLOSURE OF THE INVENTION

The present invention provides a sputtering target which comprises SiC and metallic Si and which has an atomic ratio of C to Si of from 0.5 to 0.95 and a density of from $2.75 \times 10^3$ $kg/m^3$ to $3.1 \times 10^3$ $kg/m^3$.

DETAILED DESCRIPTION OF THE PREFERRED EMBODIMENTS

In the target of the present invention, the atomic ratio of C to Si (the sum of Si in SiC and Si in metallic Si), i.e. C/Si (atomic ratio), is from 0.5 to 0.95. The metallic Si in the present invention is meant for commonly known Si having a nature of a semiconductor.

If C/Si (atomic ratio) in the target of the present invention is less than 0.5, the Si amount tends to be large, and the film-forming speed tends to decrease. If it exceeds 0.95, the film-forming speed likewise tends to decrease. For example, when C/Si (atomic ratio) is 1.0, i.e. in the case of SiC, the film-forming speed is low as compared with in the case of a target of the present invention comprising SiC and metallic Si as the main components. C/Si (atomic ratio) is particularly preferably from 0.7 to 0.9.

In a case where C/Si (atomic ratio) is within a range of from 0.5 to 0.95, if the density is less than $2.75 \times 10^3$ $kg/m^3$, the discharge tends to be instable, and if it exceeds $3.1 \times 10^3$ $kg/m^3$, the film-forming speed tends to decrease.

The target of the present invention comprises SiC and metallic Si, as the main components, whereby cracking along grain boundaries or along cleavage planes of Si particles which used to be a cause for cracking, will be suppressed by a phase of SiC. Further, the chemical bonding strength between Si and C in SiC is strong, whereby the target is scarcely susceptible to cracking even if a large electric power is applied.

In the target of the present invention, the metallic Si is preferably present to fill spaces among SiC particles and to constitute a continuous body from the viewpoint of the resistivity, discharge stability and thermal conductivity.

The thermal conductivity of the target of the present invention is preferably at least 100 W/(m·K). If the thermal conductivity is less than 100 W/(m·K), the target tends to have a high temperature locally, whereby the target tends to have damages such as cracks. Further, due to a local high temperature of the target, such a portion tends to be susceptible to oxidation and thus is likely to cause deterioration of the film-forming speed. The higher the thermal conductivity, the better. However, if it exceeds 200 W/(m·K) there will be no difference in the effects of suppressing local temperature rise.

In the target of the present invention, the total of impurities (components other than Si and C) is preferably at most 1 mass %, based on the total amount of the target, with a view to obtaining a film composed mainly of a $SiO_2$ film having a low refractive index.

The target of the present invention comprises SiC and metallic Si as the main components, whereby as compared with conventional Si targets, the film-forming speed can be made large per unit applied electric power. It is considered that as compared with Si, with SiC, generation of secondary electrons is low, and the sputtering current tends to be low, whereby the voltage tends to be relatively high, and the sputtering efficiency is thereby improved.

The relative density of the target of the present invention is preferably at least 60% from the viewpoint of the stability of discharge during the film forming. Further, the resistivity of the target of the present invention is preferably at most 0.5 Ω·m from the viewpoint of carrying out DC sputtering. Further, it is preferably at most 0.03 Ω·m from the viewpoint of the stability of discharge.

The target of the present invention is useful also for RF (radio frequency) sputtering.

As compared with other targets comprising SiC as the main component, the target of the present invention is excellent in electrical conductivity, whereby electric discharge machining is possible, and the plasma will be stabilized during sputtering discharge. Further, the target of the present invention can easily be processed by mechanical processing.

The target of the present invention is prepared, for example, as follows.

To SiC powder, a dispersing agent, a binder (such as an organic binder) and water are adjusted and added, followed by stirring to obtain a slurry of SiC. Then, this slurry is introduced into a gypsum mold and molded by casting. After through drying, the molded product is obtained by removing it from the mold.

The casting method is an industrially useful molding method which is inexpensive and provides high productivity and whereby a product having a large area or an irregular shaped product other than a flat plate can also be formed.

In the above example, the molded product is obtained by a casting method, but a press molding method or an extrusion molding method may also be used. Further, with respect to the shape of the molded product, a desired shape such as a plate shape or a cylindrical shape may suitably be selected.

The molded product thus obtained, may be dried, as the case requires. Further, in a case where a sintered product is to be obtained from the molded product, the molded product is fired at a temperature of from 1450° C. to 2300° C. in vacuo or in a non-oxidizing atmosphere, to obtain a sintered product. The sintering temperature is preferably from 1500° C. to 2200° C., particularly preferably from 1600° C. to 1800° C., whereby pores will be formed which are suitable for the next step of impregnation with molten Si.

The obtained molded product or sintered product is impregnated with molten metal Si at a temperature of from 1450° C. to 2200° C. in vacuo or in a reduced pressure non-oxidizing atmosphere, to have pores of the molded product or sintered product filled with the metallic Si, to obtain a target. With a view to suppressing the evaporation amount of Si while promoting impregnation of Si, it is preferably from 1500° C. to 2200° C., particularly preferably from 1500° C. to 1800° C.

As conventional methods for producing SiC targets, a pressureless sintering method, a hot pressing method and a reaction sintering method are, for example, known.

However, in the pressureless sintering method, an impurity is usually involved as a sintering aid, and shrinkage takes place by sintering, whereby a residual stress will remain in the sintered product, which is likely to cause cracking of the target.

By the hot pressing method, it is difficult to obtain a sintered product having a large area, and, like the above-mentioned pressureless sintering method, a residual strain will remain in the sintered product, which is likely to cause cracking of the target. Further, after hot pressing, processing such as scraping is required, and the method is not efficient. Further, the hot pressing method is not suitable for the production of a cylindrical shape or a complicated shape.

The reaction sintering method is a method wherein a molded product is obtained by using a SiC powder and a carbon powder as raw materials, and then the carbon in the molded product and impregnated molten Si are reacted. By such a method, a volume expansion takes place at the time of the reaction of the carbon with molten Si, and consequently, a residual stress will remain, which is likely to cause cracking of the target. Further, it is difficult to obtain a slurry wherein the SiC powder and the carbon powder used as raw materials, are uniformly mixed, whereby a casting method industrially useful can hardly be employed. For such a reason, in the present invention wherein molten Si is impregnated, it is preferred not to use carbon powder as a raw material.

In the process for producing the target of the present invention, the method of impregnating the molded product with molten Si without sintering the molded product is superior in the productivity, since the sintering step is omitted.

Further, the method of impregnating it with molten Si after firing the molded product to obtain a sintered product, has a merit in that impurities will be evaporated in the sintering step, whereby a target of higher purity can be obtained.

The target of the present invention is usually processed into a predetermined size and then 1) bonded to a backing plate made of metal by a bonding material (such as indium), or 2) mechanically fixed to a cathode by a jig such as a cramp and then used.

The present invention further provides a film-forming method which comprises forming a film comprising $SiO_2$ as the main component in an atmosphere containing an oxidizing gas by a sputtering method, characterized in that as a sputtering target, the above-described sputtering target is used. As the sputtering method in the present invention, a sputtering method capable of high speed film forming may be mentioned. Specifically, a DC sputtering method, a sputtering method with a frequency lower than the frequency in the RF sputtering method, or a sputtering method having the waveform of the applied current/applied voltage in DC sputtering changed (for example, changed into a rectangular shape), may be mentioned. Each of such sputtering methods is a sputtering method requiring an electrically conductive target.

In the present invention, the film comprising $SiO_2$ as the main component (hereinafter referred to simply as a $SiO_2$ film) is preferably such that the $SiO_2$ component is at least 99 mass %, based on the total amount of the film. The refractive index at a wavelength of 633 nm of the $SiO^2$ film in the present invention, is preferably at most 1.50, particularly preferably at most 1.48.

The $SiO_2$ film in the present invention preferably contains a C component slightly or contains substantially no C component. If C is 0.2 mass % or less, based on the total amount of the film, a $SiO_2$ film having a low refractive index, which shows no substantial absorption of light, will be obtained.

In order to form the $SiO_2$ film at a high speed, it is important that 1) a large electric power can be applied to the target, and 2) the film-forming speed per unit applied electric power, can be made high.

As the applied electric power, it is preferred that the power density against the target (one obtained by dividing the maximum power by the area on the discharge surface side of the target) is at least 10 $W/cm^2$, with a view to obtaining the $SiO_2$ film at a high speed.

In reactive sputtering in an atmosphere containing an oxidizing gas, the target surface is oxidized, whereby a stress is likely to form between the surface and the interior of the target, whereby the target is likely to undergo cracking. However, SiC will suppress oxidation of the target surface, and, as mentioned above, it has high resistance against cracking, whereby cracking is less likely to occur even in such reactive sputtering.

In the film-forming method of the present invention, an oxidizing gas (such as $O_2$ gas or $CO_2$ gas) is contained in the sputtering atmosphere (i.e. the sputtering gas) during film forming by sputtering. By adjusting the partial pressure of the oxidizing gas during film forming by sputtering, the C component of SiC in the target can be prevented from being taken into the film, whereby a $SiO_2$ film free from impurity can be obtained.

In the film-forming method of the present invention, the C component of SiC in the target will be reacted with the oxidizing gas (particularly preferably the $O_2$ gas) in the atmosphere during film forming to form $CO_2$ or CO, which is then discharged by a vacuum pump.

In the present invention, the $SiO_2$ film is formed, for example, as follows.

The target of the present invention is mounted on a magnetron DC sputtering apparatus. Then, the film-forming chamber is evacuated, and then, as a sputtering gas, a mixed gas of Ar gas and $O_2$ gas, is introduced. The proportion of the $O_2$ gas in the sputtering gas is preferably from 20 volume % to 100 volume %. If it is lower than 20 volume %, oxidation tends to be inadequate, whereby a non-absorptive $SiO_2$ film tends to be hardly obtainable. From the viewpoint of the film-forming speed, it is preferably at most 80 volume %. Especially, the proportion of the $O_2$ gas in the sputtering gas is preferably from 30 volume % to 80 volume %.

In the present invention, it is preferred to apply a voltage of a pulsed waveform to the target in order to suppress arcing during film forming.

The substrate on which the $SiO_2$ film is formed, is not particularly limited, and a glass substrate, a plastic substrate or a plastic film may, for example, be mentioned.

The thickness of the $SiO_2$ film (the geometrical film thickness) is preferably from 10 nm to 1 μm from the viewpoint of using as an antireflection film.

EXAMPLE 1

A dispersing agent was added to a SiC powder and mixed in a ball mill using distilled water as a medium. Then, a binder was further added, followed by stirring to obtain a slurry for casting. The slurry was introduced into a gypsum mold, and casting was carried out. After drying, the molded product was removed from the mold and further thoroughly dried. Then, it was held for two hours at 1600° C. to carry out firing in vacuo while evacuating by means of a vacuum pump. The density of the obtained sintered product was $2.6 \times 10^3$ $kg/m^3$ (relative density: about 81%). This sintered product was immersed in metallic Si melted at 1600° C. in vacuo to have metallic Si impregnated to obtain a target comprising SiC and metallic Si as the main components.

The density of the obtained target was $3.0 \times 10^3$ $kg/m^3$ (relative density: about 100%). The resistivity of the target was $1.2 \times 10^3$ $\Omega \cdot m$. C/Si (atomic ratio) of this target was 0.8. The thermal conductivity of the target as measured by a laser flash method, was 150 $W/(m \cdot K)$. Further, the target was subjected to an X-ray diffraction analysis, whereby only crystal phases of SiC and Si were observed. Further, it was confirmed that metallic Si was present to fill spaces among SiC particles and to constitute a continuous body.

Further, by ICP (inductively coupled plasma emission spectrometry), the amounts of metal impurities based on the total amount of the target were measured, whereby Al was 0.01 mass %, Fe was 0.005 mass %, Ti was 0.002 mass %, Ca was 0.001 mass %, Mg was less than 0.001 mass %, V is 0.003 mass %, Cr was less than 0.001 mass %, Mn was 0.002 mass %, and Ni was less than 0.001 mass %.

The obtained target was subjected to electric discharge machining and grinding to a size of 150 mm in diameter and 15 mm in thickness and bonded to a backing plate made of copper by a metal bond. This target was mounted on a magnetron DC sputtering apparatus, and film forming was carried out. The grinding at that time was easy. The conditions during film forming were such that the back pressure was $1.3 \times 10^{-3}$ Pa, and the sputtering pressure was 0.4 Pa. As the sputtering gas, a mixed gas of Ar and $O_2$ wherein the proportion of $O_2$ gas in the sputtering gas was 50 volume %, was employed.

Further, the applied electric power was 3 kW, and the electric power was applied so that the voltage would be a rectangular wave. The power density at that time was 17 $W/cm^2$. When the time during which a minus voltage was applied, is represented by ON time, and the time during which a plus voltage was applied, is represented by OFF time, the ON time was set to be $50 \times 10^{-6}$ sec, and the OFF time was set to be $50 \times 10^{-6}$ sec. At that time, the voltage during the ON time was $-720V$. Further, the voltage during the OFF time was set to be $+50V$.

As the substrate, a soda lime glass substrate was used. To the substrate, no intentional heating was applied. The operation was carried out so that the film thickness would be about 500 nm. The discharge during sputtering was very stable, and film forming was carried out stably even by DC sputtering.

After film forming, the film thickness was measured by means of a film thickness measuring apparatus of feeler type. The film-forming speed per unit applied electric power was 120 $nm/(min \cdot kW)$, and the film-forming speed was 360 nm/min.

The refractive index of the film was measured by an ellipso meter. The wavelength of light used was 633 nm (measured in the same manner in other Examples). The refractive index of the film was 1.46. The obtained film was analyzed by XPS (X-ray photo electron spectroscopy) (measured in the same manner in other Examples), and the main components were confirmed to be Si and O. C in the film was 0.04 mass % based on the total amount of the film.

EXAMPLE 2 (COMPARATIVE EXAMPLE)

Film forming was carried out under the same conditions as in Example 1 using a commercially available polycrystal Si target having the same size as in Example 1. At an applied power of 3 kW (power density: 17 $W/cm^2$), cracking was observed in the target, and the discharge was instable. Therefore, the applied power was lowered to 1 kW (power density: 5.7 $W/cm^2$), and film forming was carried out under the same conditions as in Example 1 except that the voltage during the ON time was changed to $-360V$, whereby the discharge was stable, and film forming was possible. The film-forming speed per unit applied power at that time was 70 $nm/(min \cdot kW)$, and the film-forming speed was 70 nm/min. The obtained film had a refractive index of 1.46, and was a film composed of Si and O.

EXAMPLE 3 (COMPARATIVE EXAMPLE)

Film forming was carried out under the same conditions as in Example 1 using a SiC sintered target (CERAROI-C, trade name, manufactured by Asahi Glass Company, Limited) of the same size as in Example 1. After the film forming, the film thickness was measured by means of a film thickness measuring apparatus of feeler type. The film-forming speed per unit applied power was 100 $nm/(min \cdot kW)$, and the film-forming speed was 300 nm/min. The refractive index of the film was 1.48.

EXAMPLE 4

After preparing a molded product by a casting method as in Example 1, without carrying out the sintering in Example 1, the molded product was immersed in molten Si in the same manner as in Example 1 to obtain a target comprising SiC and metallic Si as the main components. The C/Si (atomic ratio), the density, the resistivity and the thermal conductivity, of the obtained target, were equal to those in Example 1. Further, with respect to the crystal phases, only crystal phases of SiC and Si were observed as in Example 1. Further, it was confirmed that the metallic Si was present to fill spaces among SiC particles and to constitute a continuous body.

Further, by the same method as in Example 1, the amounts of metal impurities based on the total amount of the target were measured, whereby Al was 0.07 mass %, Fe was 0.02 mass %, Ti was 0.002 mass %, Ca was 0.008 mass %, Mg was less than 0.001 mass %, V was 0.003 mass %, Cr was less than 0.001 mass %, Mn was 0.003 mass %, and Ni was less than 0.001 mass %.

This target was processed in the same manner as in Example 1, and then film forming was carried out under the same conditions as in Example 1. After the film forming, the film thickness was measured by means of a film thickness measuring apparatus of feeler type. The film-forming speed per unit applied power was 120 nm/(min·kW), and the film-forming speed was 360 nm/min. The refractive index of the film was 1.46, and the C amount was 0.04 mass %.

The target of the present invention has durability improved against cracking during film forming by sputtering, whereby a large electric power can be applied, and it is suitable for high speed film-forming of a $SiO_2$ film. Further, electric discharge machining is possible, and its mechanical processing is also easy, whereby it can easily be processed into a desired shape.

Further, according to the process for producing the target of the present invention, the target of the present invention can be produced is good production efficiency.

Further, according to the film-forming method of the present invention, a $SiO_2$ film having a low refractive index, can be formed at a high speed.

The entire disclosure of Japanese Patent Application No. 11-291480 filed on Oct. 13, 1999 including specification, claims and summary are incorporated herein by reference in its entirety.

What is claimed is:

1. A sputtering target which comprises SiC and metallic Si and which has an atomic ratio of C to Si of from 0.5 to 0.95 and a density of from $2.75 \times 10^3$ kg/m$^3$ to $3.1 \times 10^3$ kg/m$^3$, wherein the sputtering target comprises at most 1 mass % of elements other than Si and C.

2. The sputtering target according to claim 1, wherein the thermal conductivity of the sputtering target is at least 100 W/(m·K).

3. A process for producing a sputtering target, the process comprising molding a SiC powder by a casting method, a press molding method or an extrusion molding method to form a molded, product:

impregnating the molded product with molten Si at a temperature in a range of from 1450° C. to 2200° C., in vacuo or in a reduced pressure non-oxidizing atmosphere, to have pores of the molded product filled with the metallic Si; and producing the sputtering target of claim 1.

4. The process according to claim 3, wherein the molded product is impregnated with molten Si at a temperature of from 1,500° C. to 2,200° C.

5. A process for producing a sputtering target, the process comprising molding a SiC powder by a casting method, a press molding method or an extrusion molding method to form a molded product;

firing the molded product at a temperature of from 1450° C. to 2300° C. to obtain a sintered product;

impregnating the sintered product with molten Si at a temperature in a range of from 1450° C. to 2200° C., in vacuo or in a reduced pressure non-oxidizing atmosphere, to have pores of the sintered product filled with the metallic Si; and producing the sputtering target of claim 1.

6. The process according to claim 5, wherein the molded product is impregnated with molten Si at a temperature of from 1,500° C. to 2,200° C.

7. The process according to claim 5, wherein the molded product is fired at a temperature of from 1,600° C. to 1,800° C.

8. A method of using a sputtering target, the method comprising forming a film comprising $SiO_2$ as the main component in an atmosphere containing an oxidizing gas by a sputtering method using the sputtering target of claim 1.

9. The method according to claim 8, wherein the sputtering method is a DC sputtering method.

10. The method according to claim 8, wherein the film comprising $SiO_2$ as the main component has a refractive index of at most 1.50 at a wavelength of 633 nm.

11. The sputtering target according to claim 1, wherein the SiC is in the of particles; and the metallic Si is present in spaced among the SiC particles.

12. The sputtering target according to claim 1, which has a relative density of at least 60%.

13. The sputtering target according to claim 1, having a resistivity of at most 0.5 Ω.

14. The sputtering target according to claim 13, wherein the resistivity is at most 0.03 Ω·m.

15. The sputtering target according to claim 1, wherein the atomic ratio of C to Si (C/Si) is from 0.7 to 0.9.

* * * * *